United States Patent [19]

Taneya et al.

[11] Patent Number: 4,799,225
[45] Date of Patent: Jan. 17, 1989

[54] SEMICONDUCTOR LASER ARRAY DEVICE

[75] Inventors: Mototaka Taneya, Sakura; Sadayoshi Matsui; Mitsuhiro Matsumoto, both of Tenri, all of Japan

[73] Assignee: Sharp Kabushiki Kaisha, Osaka, Japan

[21] Appl. No.: 104,865

[22] Filed: Oct. 5, 1987

[30] Foreign Application Priority Data

Oct. 7, 1986 [JP] Japan ............................ 61-238240

[51] Int. Cl.$^4$ .............................................. H01S 3/19
[52] U.S. Cl. ........................................ 372/44; 372/50; 372/45
[58] Field of Search ............................ 372/45, 50, 46

[56] References Cited

U.S. PATENT DOCUMENTS

| 4,047,124 | 9/1977 | Ford et al. | 372/50 |
| 4,136,928 | 1/1979 | Logan et al. | 372/45 |
| 4,159,452 | 6/1979 | Logan et al. | 372/45 |
| 4,255,717 | 3/1981 | Safres et al. | 372/56 |
| 4,369,513 | 1/1983 | Umeda et al. | 372/50 |
| 4,718,069 | 1/1988 | Streifer et al. | 378/45 |

Primary Examiner—Leon Scott, Jr.
Attorney, Agent, or Firm—Ciotti & Murashige, Irell & Manella

[57] ABSTRACT

A semiconductor laser array device with a waveguide structure comprising a first array portion which is composed of a plurality of parallel waveguides; a second array portion which is composed of a plurality of parallel waveguides; a third array portion which is composed of a plurality of symmetrically branching waveguides that optically connect the ends of the parallel waveguides of the first array portion; and a fourth array portion which is composed of a plurality of symmetrically branching waveguides that are optically connected to the other ends of the parallel waveguides of the second array portion, the ends of said symmetrically branching waveguides of the fourth array portion meeting one laser-emitting face of said laser array device at which said symmetrically branching waveguides begin to be optically combined with the adjacent symmetrically branching waveguides.

2 Claims, 2 Drawing Sheets

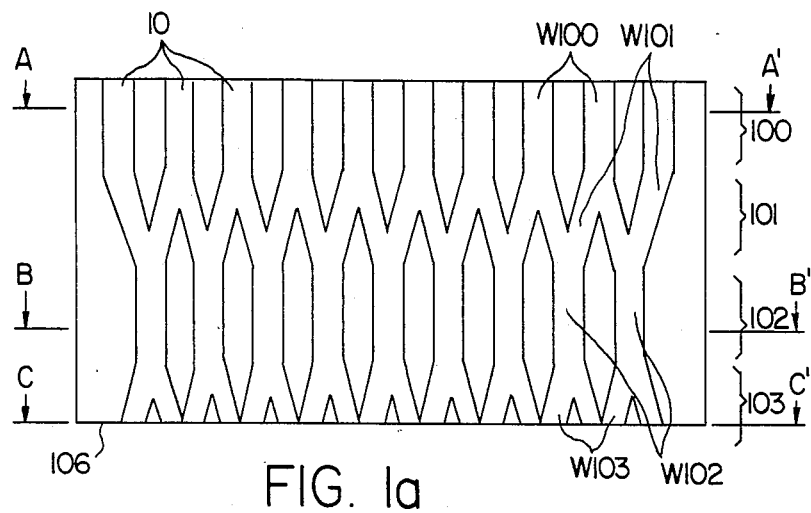
FIG. 1a
FIG. 1b
FIG. 1c
FIG. 1d
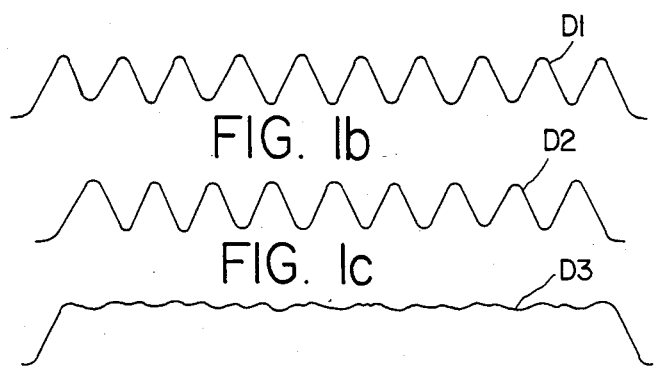
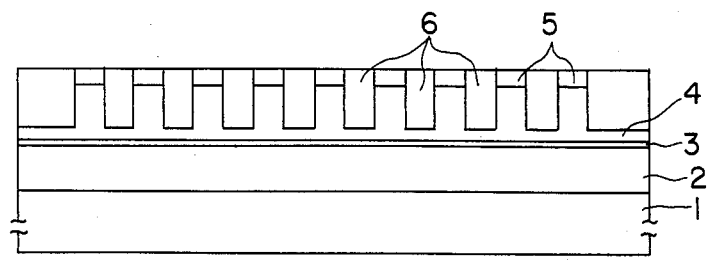
FIG. 2

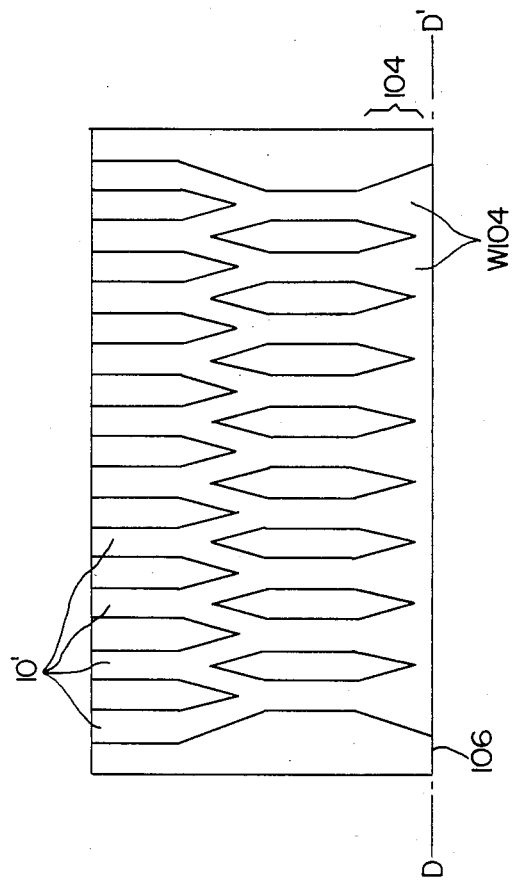
FIG. 3
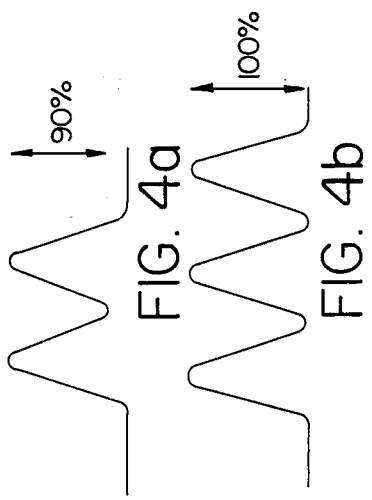
FIG. 4a
FIG. 4b

SEMICONDUCTOR LASER ARRAY DEVICE

BACKGROUND OF THE INVENTION

1. Field of the Invention

This invention relates to a semiconductor laser array device. More particularly, it relates to a semiconductor laser array device which attains an optical intensity distribution with a minimized ripple of its far-field pattern and which produces high optical output power.

2. Description of the Prior Art

Semiconductor laser devices which are useful as light sources for optical discs, laser printers, optical measuring systems, etc., must produce high output power. However, conventional semiconductor laser devices having a single waveguide structure can only produce low output power, 60-70 mW at their best. In order to osillate laser lights in a array mode (i.e., a 0° phase-shift mode, resulting in a single narrow beam with higher output power), semiconductor laser array devices, in which a plurality of waveguides are disposed in a parallel manner to achieve an optical phase-coupling between the adjacent waveguides, have been studied, for example, by D. R. Scifres, et al., Electronics Letters, Vol. 19, 169-171, 1983. However, their study of semiconductor laser array devices is focussed on the achievement of a single peak of the far-field pattern and/or the achievement of a single peak of the far-field pattern which approaches the diffraction limit, but it is not focussed on the achievement of the uniformity of the optical intensity distribution of the near-field pattern.

FIG. 4(a) shows the optical intensity distribution attained by a conventional semiconductor laser array device having a symmetrically branching waveguide structure. (Using this laser array device, single 0° phase-shift mode oscillation was first observed by the inventors of this invention.) As seen from FIG. 4(a), the ripple index of the optical intensity distribution of the near-field pattern is around 90%, which has been reported by M. Taneya, et al., Applied Physics Letters, Vol. 47(4), 341-343, 1985.

FIG. 4(b) shows the optical intensity distribution of the near-field pattern in 180° phaseshift mode oscillation attained by a conventional semiconductor laser array device. The ripple index thereof is 100%, which has been reported by M. Matsumoto, et al., Journal of Applied Physics, Vol. 58(7), 2783-2785, 1985.

Semiconductor laser array devices which are used for optical communication systems utilizing the image formation of the near-field pattern are required to achieve the uniformity of the optical intensity distribution of the near-field pattern.

SUMMARY OF THE INVENTION

The semiconductor laser array device with a waveguide structure of the invention, which overcomes the above-discussed and numerous other disadvantages and deficiencies of the prior art, comprises a first array portion which is composed of a plurality of waveguides in a parallel manner with an optical phase-coupling between the adjacent waveguides with a certain pitch, a second array portion which is composed of a plurality of waveguides in a parallel manner with an optical base-coupling between the adjacent waveguides at the position displaced half way between the position of each of the waveguides of the first array portion, a third array portion which is composed of a plurality of symmetrically branching waveguides that optically connect the ends of the parallel waveguides of the first array portion with the ends of the parallel waveguides of the second array portion, and a fourth array portion which is composed of a plurality of symmetrically branching waveguides that are optically connected to the other ends of the parallel waveguides of the second array portion, the ends of said symmetrically branching waveguides of the fourth array portion meeting one laser-emitting face of said laser array device at which said symmetrically branching waveguides begin to be optically combined with the adjacent symmetrically branching waveguides. The optical intensity distribution of the near-field pattern attained by the laser array device at said light-emitting face exhibits minimized ripple of its near-field pattern.

The semiconductor laser array device with a waveguide structure of this invention also comprises a first array portion which is composed of a plurality of waveguides in a parallel manner with an optical phase-coupling between the adjacent waveguides with a certain pitch, a second array portion which is composed of a plurality of waveguides in a parallel manner with an optical phase-coupling between the adjacent waveguides at the position displaced half way between the position of each of the waveguides of the first array portion, a third array portion which is composed of a plurality of symmetrically branching waveguides that optically connect the ends of the parallel waveguides of the first array portion with the ends of the parallel waveguides of the second array portion, and a fourth array portion which is composed of a plurality of delta-shaped waveguides that are optically combined with the adjacent delta-shaped waaveguides, resulting in one waveguide along the light-emitting face line. The optical intensity distribution of the near-field pattern attained by the laser array device at said light-emitting face exhibits minimized ripple of its far-field pattern.

Thus, the invention described herein makes possible the objects of (1) providing a semiconductor laser array device which produces high output power; and (2) providing a semiconductor laser array device which attains an optical intensity distribution with a minimized ripple index of the near-field pattern.

BRIEF DESCRIPTION OF THE DRAWINGS

This invention may be better understood and its numerous objects and advantages will become apparent to those skilled in the art by reference to the accompanying drawings as follows:

FIG. 1(a) is a plane view showing a semiconductor laser array device of this invention.

FIGS. 1(b), 1(c) and 1(d), respectively, are the optical intensity distributions at the cross-sections of the semiconductor laser array device taken on lines A-A', B-B' and C-C' in FIG. 1(a).

FIG. 2 is a cross sectional view showing the semiconductor laser array device of FIG. 1(a).

FIG. 3 is as plane view showing another semiconductor laser array device of this invention.

FIGS. 4(a) and 4(b), respectively, are the optical intensity distributions of the near-field pattern of conventional semiconductor laser array devices.

DESCRIPTION OF THE PREFERRED EMBODIMENTS

FIG. 1(a) shows the symmetrically branching waveguide structure of a semiconductor laser array device of this invention. The waveguide structure comprises a first array portion 100 which is composed of a plurality of waveguides W100 that are disposed in a parallel manner to achieve an optical phase-coupling between the adjacent waveguides W100 with a certain pitch, a second array portion 102 which is composed of a plurality of waveguides W102 that are disposed in a parallel manner to achieve an optical phase-coupling between the adjacent waveguides W102 at the position displaced half way between the position of each of the waveguides W100 of the first array position 100, and a third array portion 101 which is composed of a plurality of symmetrically branching waveguides W101 that optically connect the ends of the parallel waveguides W100 with the ends of the parallel waveguides W102. The waveguide structure of the said semiconductor laser array device of this invention further comprises a fourth array portion 103 which is composed of a plurality of symmetrically branching waveguides W103 that are optically connected to the other ends of the parallel waveguides W102 of the second array portion 102. The ends of the said symmetrically branching waveguides W103 meet the laser light-emitting face 106 of the laser array device at which the said waveguides W103 begin to be optically combined with the adjacent waveguides W103.

This semiconductor laser array device is produced as follows: As shown in FIG. 2, on an n-GaAs substrate 1, an n-Al$_x$Ga$_{1-x}$As cladding layer 2 having a thickness of 1.0 μm, an n- or p-Al$_y$Ga$_{1-y}$As active layer 3 having a thickness of 0.08 μm, a p-Al$_x$Ga$_{1-x}$As cladding layer 4 having a thickness of 0.8 μm and a p-GaAs contact layer 5 having a thickness of 0.2 μm are successively grown by a well known crystal growth technique (wherein x>y). Then, a Si$_3$N$_4$ film is formed on the entire surface of the contct layer 5 by plasma assisted chemical vapor deposition, followed by a photolithographic treatment and an etching treatment to form a pattern 10 corresponding to the waveguide structure shown in FIG. 1(a).

Thereafter, the wafer is subjected to a reactive ion beam etching treatment to remove parts of the cladding layer 4 and the cap layer 5, resulting in mesas corresponding to the waveguide pattern 10. Each of the mesas has a width of 3 μm, a pitch of 4 μm and a depth of 0.75 μm. The thickness of the p-Al$_x$Ga$_{1-x}$As cladding layer 4 outside of the mesas is 0.25 μm. Then, a high-resistive Al$_z$Ga$_{1-z}$As layer 6 is grown on the area except for the remaining Si$_3$N$_4$ film by metal-organic chemical vapor deposition or liquid phase epitaxy (wherein z>x) in such a manner that the grooves (i.e., the portions outside of the mesas) are buried by the Al$_z$Ga$_{1-z}$As layer 6 so as to make the surface of the wafer flat. The remaining Si$_3$N$_4$ film is then removed. The p-sided ohmic contact (not shown) is formed on the entire surface of the grown layer and the n-sided ohmic contact (not shown) is formed on the entire bottom surface of the substrate 1, followed by cleaving to form laser mirrors at both facets, resulting in an array device unit having an internal cavity length of about 300 μm. The facets are then coated with a single or multi-layered film of, for example, Al$_2$O$_3$, resulting in the rear facet with a reflectivity of 90% and the front facet with a reflectivity of 3%.

The resulting semiconductor laser array device exhibits the optical intensity distribution D1 at the cross-section thereof taken on line A-A' (shown in FIG. 1(b)) and the optical intensity distribution D2 at the cross-section thereof taken on line B-B' (shown in FIG. 1(c)). Although the position of each of the parallel waveguides W100 of the first array portion 100 is different in half way from that of each of the parallel waveguides W102 of the second array portion 102, the ripple index of each of the optical intensity distributions D1 and D2 with regard to the array portions 100 and 102 is 80-90%. This is because a 0° phase-shift mode is selected by the symmetrically branching waveguide structure constituting the third array portion 101. If modes other than a 0° phase-shift mode are selected, the ripple index of each of the optical intensity distributions D1 and D2 will become 100%. It was observed that this semiconductor laser array device oscillated laser lights in a single mode with a 0° phase-shift therebetween up to high output power.

From the above-mentioned phenomena, it can be seen that the symmetrically branching waveguides W101 function to gradually change the pattern of the optical intensity distribution from the optical intensity distribution D1 to the optical intensity distribution D2. This means that a cross-section of the laser array device, at which the pattern of the optical intensity distribution (i.e., the ripple index thereof being minimized) that is the same as that of an optical intensity distribution obtained by overlapping the above-mentioned two patterns of the distribution D1 and D2 can be attained, necessarily exists. Accordingly, the fourth array portion 103 is constituted by the symmetrically branching waveguides W103 and the position at which the optical intensity distribution with a minimized ripple index can be achieved is selected to be one facet 106 of the laser array device. That is, the symmetrically branching waveguides W103 of the fourth array portion 103 are designed such that the ends thereof meet the light-emitting face 106 at which the said waveguides W103 begin to be combined with the adjacent waveguides W103 and at which the waveguides which are positioned with half way difference from the positions of the waveguides W102 of the third array portion 102 are not yet formed. By the formation of the fourth array portion 103, the semiconductor laser array device of this invention attains the optical intensity distribution of the near-field pattern D3 with a minimized ripple index at the light-emitting face 106 taken on line C-C' as shown in FIG. 1(d). In this example, the ripple index of the optical intensity distribution was reduced to about 8% and the laser array device attained 250 mW output power.

FIG. 3 shows another semiconductor laser array device of this invention, in which the waveguide structure of the fourth array portion 104 in the vicinity of the light-emitting face 106 is not constituted by symmetrically branching waveguides, but it is constituted by a plurality of delta-shaped waveguides W104 which are optically combined with the adjacent delta-shaped waveguides W104, resulting in one waveguide along the light-emitting face line. The optical intensity distribution of the near-field pattern attained by the semiconductor laser array device shown in FIG. 3 at the cross-section taken on line D-D' has the same pattern as that of the near-field pattern D3 (FIG. 1(d)) that is attained by the semiconductor laser array device of FIG. 1(a).

The ripple index thereof is 5% and the laser array device attained 200 mW output power at the maximum.

According to the above-mentioned examples, semiconductor laser array devices, which attain the optical intensity distribution of the near-field pattern with a minimized ripple index ranging from 5 to 8% and which oscillate laser lights with 200-250 mW output power, can be obtained.

This invention is not limited to the above-mentioned examples, but is is, of course, applicable to devices having a polarity different from that of the above-mentioned examples, devices using semiconductor materials therein such as InGaAsP/InP systems different from those of above-mentioned examples, devices having an optical guiding layer, devices having a single or multi-layered quantum well, devices having the number of waveguides different from the number of waveguides of the above-mentioned examples, and devices having a lasing structure such as ridged waveguide structure, a loss waveguide structure, a buried heterostructure, etc., different from that of the above-mentioned examples.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser array device with a waveguide structure comprising:
    a first array portion which is composed of a plurality of waveguides in a parallel adjacent manner with an optical phase-coupling between the adjacent waveguides with a predetermined pitch,
    a second array portion which is composed of a plurality of waveguides in a parallel manner with an optical phase-coupling between the adjacent waveguides at the position displaced half way between the position of each of the waveguides of the first array portion,
    a third array portion which is composed of a plurality of symmetrically branching waveguides that optically connect the ends of the parallel waveguides of the first array portion with the ends of the parallel waveguides of the second array portion, and
    a fourth array portion which is composed of a plurality of symmetrically branching waveguides that are optically connected to the other ends of the parallel waveguides of the second array portion, the ends of said symmetrically branching waveguides of the fourth array portion meeting one laser-emitting face of said laser array device at which said symmetrically branching waveguides begin to be optically combined with the adjacent symmetrically branching waveguides, wherein the waveguide structure produces a near-field pattern at said light-emitting face with said near-field pattern having an optical intensity distribution exhibiting minimized ripple.

2. A semiconductor laser array device with a waveguide structure comprising:
    a first array portion which is composed of a plurality of waveguides in a parallel adjacent manner with an optical phase-coupling between the adjacent waveguides with a predetermined pitch,
    a second array portion which is composed of a plurality of waveguides in a parallel manner with an optical phase-coupling between the adjacent waveguides at the position displaced half way between the position of each of the waveguides of the first array portion,
    a third array portion which is composed of a plurality of symmetrically branching waveguides that optically connect the ends of the parallel waveguides of the first array portion with the ends of the parallel waveguides of the second array portion, and
    a fourth array portion which is composed of a plurality of delta-shaped waveguides that are optically combined with the adjacent delta-shaped waveguides, resulting in one waveguide along the light-emitting face line, such that the waveguide structure produces a near-field pattern at said light-emitting face with said near-field pattern having an optical intensity distribution exhibiting minimized ripple.

* * * * *